United States Patent
Asano et al.

(10) Patent No.: US 6,946,891 B2
(45) Date of Patent: Sep. 20, 2005

(54) SWITCHING CIRCUIT DEVICE

(75) Inventors: Tetsuro Asano, Oizumi-machi (JP);
Mikito Sakakibara, Kumagaya (JP);
Toshikazu Hirai, Oizumi-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/781,941

(22) Filed: Feb. 20, 2004

(65) Prior Publication Data

US 2004/0223274 A1 Nov. 11, 2004

(30) Foreign Application Priority Data

Feb. 20, 2003 (JP) .......................................... 2003-042419

(51) Int. Cl.[7] .................................................. H03K 5/08
(52) U.S. Cl. ........................................ 327/318; 327/566
(58) Field of Search ................................. 327/309, 310, 327/314, 318, 319, 320, 324, 325, 326, 327, 328, 333, 564, 565, 566

(56) References Cited

FOREIGN PATENT DOCUMENTS

JP  2723936  12/1988
JP  8-236549  3/1995

*Primary Examiner*—Jeffrey Zweizig
(74) *Attorney, Agent, or Firm*—Morrison & Foerster LLP

(57) ABSTRACT

Since improvement measures are not taken in regard to the electrostatic breakdown voltage, electrostatic breakdown voltages, between the common input terminal IN—first control terminal Ctl-1, between the common input terminal IN—second control terminal Ctl-2, between the first control terminal Ctl-1—the first output terminal OUT1, and between the second control terminal Ctl-2—the second output terminal OUT2, where both ends of gate Schottky junctions of FETs are lead out to the exterior, are low. To solve the problem, the embodiment of the invention provides a switch circuit device, wherein protecting elements are connected by disposing two electrode pads, for connection to a single control terminal, on a chip and positioning the electrode pads near the common input terminal pad I and an output terminal pad O1 or O2. The electrostatic energies that are applied between the first output terminal OUT1—the first control terminal Ctl-1, between the common input terminal IN—the first control terminal Ctl-1, between the second output terminal OUT2—the second control terminal Ctl-2, and between the common input terminal IN—the second control terminal Ctl-2 can be respectively attenuated to the same degree and most efficiently.

12 Claims, 11 Drawing Sheets

Prior Art

Prior Art

Prior Art

SWITCHING CIRCUIT DEVICE

BACKGROUND OF THE INVENTION

1. Field of the Invention

This invention relates to a switching circuit device and particularly relates to, in a high-power switching circuit device, a switching circuit device, which is significantly improved in terms of electrostatic breakdown voltage and enables simplification of the inspection process.

2. Description of the Related Art

With a switching circuit device that is employed for an antenna switching application in a third-generation cellular phone terminal, FETs (Filed Effect transistors) must be serially connected in three stages in order to switch signals of approximately 26 dBm. This switching circuit device is called an SPDT (Single Pole Double Throw), uses a total of six FETs, and has the five external terminals of a common input terminal IN, output terminals OUT1 and OUT2, and control terminals Ctl-1 and Ctl-2.

FIGS. 10A and 10B are circuit diagrams showing an example of compound semiconductor switching circuit device of the conventional art. As shown in FIG. 10A, the switching circuit device includes a first FET set F1 and a second FET set F2, in each of which three FETs are connected serially. Also, a source electrode (or drain electrode) of FET1-1 of the first FET set F1 and a source electrode (or drain electrode) of FET2-1 of the second FET set F2 are connected to a common input terminal IN. And gate electrodes of the three FETs of the first FET set F1 are respectively connected via resistors to a common first control terminal Ctl-1 and three gate electrodes of the second FET set F2 are respectively connected via resistors to a second control terminal Ctl-2. Furthermore, a drain electrode (or source electrode) of FET1-3 of the first FET set F1 is connected to a first output terminal OUT1 and a drain electrode (or source electrode) of FET2-3 of the second FET set F2 is connected to a second output terminal OUT2. The control signals that are applied to the first and second control terminals Ctl-1 and Ctl-2 are complementary signals and the FET set, to which a H level signal is applied, turns ON and transmits an input signal applied to the common input terminal IN to one of the output terminals. The resistors are disposed for the purpose of preventing the leakage of high-frequency signals from the gate electrodes to the first and second control terminals Ctl-1 and Ctl-2, which are DC potentials, that is, AC grounded.

FIG. 10B is a circuit diagram of the first FET set F1. A circuit diagram of the second FET set F2 is designed in the same manner. As illustrated, with the FET set F1, in which multiple stages are connected serially, the source electrode of FET1-1 is connected as a source S of the FET set F1 to the common input terminal IN, the respective gate electrodes of FET1-1, FET1-2, and FET1-3 are connected in common, as a gate G of the FET set F1, to the first control terminal Ctl-1, and the drain electrode of FET1-3 is connected as a drain D of the FET set F1 to the first output terminal OUT1.

FIG. 11 shows an example of a compound semiconductor chip in which compound semiconductor switching circuit devices are integrated.

Two FET sets, F1 and F2, for performing switching are disposed on a GaAs substrate. FET set F1 has, for example, FET1-1, FET1-2, and FET1-3 connected in series. FET set F2 has FET2-1, FET2-2, and FET2-3 connected in series. Resistors R1-1, R1-2, R1-3, R2-1, R2-2, and R2-3 are respectively connected to the six gate electrodes of the respective FET sets. Also, electrode pads 1, O1, O2, C1, and C2, respectively corresponding to the common input terminal IN, the output terminals OUT1 and OUT2, and the control terminals Ctl-1 and Ctl-2, are disposed at the periphery of the substrate. Also, a second-metal layer wiring, indicated by dotted lines, is a gate metal layer (Ti/Pt/Au) 20, formed at the same time the gate electrodes of the respective FETs are formed, and a third-metal layer wiring, indicated by solid lines, is a pad metal layer (Ti/Pt/Au) 30 for connection of the respective elements and pad formation. A first-metal layer as ohmic metal layer (AuGe/Ni/Au), which forms ohmic contact with the substrate, forms the source electrodes and drain electrodes of the respective FETs and forms the lead-out electrodes at both ends of the respective resistors, and is not illustrated in FIG. 11 since it overlaps with the pad metal layer.

Since the FET set F1 and the FET set F2 are positioned symmetrically with respect to the central line of the chip and are the same in layout, FET set F1 shall be described below. With FET1-1, a three-teeth-comb-shaped third-metal layer pad metal layer 130 parts, which extend from the upper side, comprise a source electrode 109 (or drain electrode) connected to the common input terminal pad I, and below this is disposed a source electrode 106 (or drain electrode) formed by the first-metal layer ohmic metal layer. Also, the three-teeth-comb-shaped third-metal layer pad metal layer 130 parts, which extend from the lower side, comprise a drain electrode 110 (or source electrode) of FET1-1, and below this is disposed a drain electrode 107 (or source electrode), formed by the first-metal layer ohmic metal layer. These electrodes are disposed in the form of engaged comb teeth and in between these, a gate electrode 105, formed of a second-metal layer gate metal layer 120, is disposed in the form of five comb teeth.

Channel regions are disposed below the parts at which the source electrode 109, the drain electrode 110, and the gate electrode 105 are disposed and these become the operating regions of FET1-1.

With FET1-2, the three comb teeth of the source electrode 106 (or drain electrode) that extend from the upper side are connected to the drain electrode 110 of FET1-1. Also, the three comb teeth of the drain electrode 110 (or source electrode) that extend from the lower side are connected to the source electrode 109 of FET1-3. The first-metal layer ohmic metal layer is disposed below these electrodes. These are disposed in the form of engaged comb teeth and in between these, the gate electrode 105, formed of the second-metal layer gate metal layer 120, is disposed in the form of five comb teeth.

With FET1-3, the three-teeth-comb-shaped third-metal layer pad metal layer 130 parts, which extend from the upper side, comprise the source electrode 109 (or drain electrode), and below this is disposed the source electrode 106 (or drain electrode) formed by the first-metal layer ohmic metal layer. Also, the three-teeth-comb-shaped third-metal layer pad metal layer 130 parts, which extend from the lower side, comprise the drain electrode 110 (or source electrode) that is connected to the output terminal pad O1, and below this is disposed the drain electrode 107 (or source electrode), formed by the first-metal layer ohmic metal layer. These electrodes are disposed in the form of engaged comb teeth and in between these, the gate electrode 105, formed of the second-metal layer gate metal layer 120, is disposed in the form of five comb teeth.

FIG. 12 shows a structure in which the above-described switching circuit device is assembled.

The semiconductor chip 67, which is shown in FIG. 11, is bonded by a silver paste or other conductive paste 70 onto an island 62f of a lead frame having five leads, and the respective terminal electrode pads of the semiconductor chip 67 are connected to the leads 62 by bonding wires 64. That is, the input terminal pad I is connected to a lead 62a, the control terminal pad C1 is connected to a lead 62b, the output terminal pad O1 is connected to a lead 62c, the control terminal pad C2 is connected to a lead 62d, and the output terminal pad O2 is connected to a lead 62e. The peripheral parts of the chip 67 are covered by a resin 75 that matches the shape of a molding die and the tips of the leads 62 are lead out to the exterior of resin 75. Such a package is called, for example, MCPH6 and has an external size of 2.1×2.0 mm$^2$.

In this switching circuit device, the communications between the common input terminal IN and the control terminal Ctl-1, between the common input terminal IN and the control terminal Ctl-2, between the control terminal Ctl-1 and the output terminal OUT1, and between the control terminal Ctl-2 and the output terminal OUT2 correspond to the communications between the source electrode and the gate electrode of FET1-1, between the source electrode and the gate electrode of FET2-1, between the gate electrode and the drain electrode of FET1-3, and between the gate electrode and the drain electrode of FET2-3, respectively. As shall be described later, with these pairs, both the anodes and cathodes of the gate Schottky junctions of the FETs that are positioned at the ends of the respective FET sets are lead out to the exterior of the circuit. Though these electrode pairs have the problem of being weak in terms of electrostatic discharge, measures for improving the electrostatic breakdown voltage have not been taken in this art.

Also, though, for example, the electrostatic breakdown voltage can be increased somewhat by making the resistors connected to the control terminals larger, this method is not appropriate as it causes the switching time to become longer.

SUMMARY OF THE INVENTION

The invention provides a switching circuit device that includes a first set of field effect transistors connected in series, a second set of field effect transistors connected in series, a common input terminal connected to a source electrode or a drain electrode of a transistor positioned at one end of the first set and connected to a source electrode or a drain electrode of a transistor positioned at one end of the second set, a first output terminal connected to a source electrode or a drain electrode of a transistor positioned at other end of the first set, a second output terminal connected to a source electrode or a drain electrode of a transistor positioned at other end of the second set, a first control terminal connected to gate electrodes of all the transistors of the first set, a second control terminal connected to gate electrodes of all the transistors of the second set, and a protecting element including an insulating region disposed between two high impurity concentration regions. The protecting element is connected between the source or drain electrode of the transistor positioned at the one end of the first set and the gate electrode of the transistor positioned at the one end of the first set, between the source or drain electrode of the transistor positioned at the one end of the second set and the gate electrode of the transistor positioned at the one end of the second set, between the source or drain electrode of the transistor connected to the first output terminal and the gate electrode of the transistor connected to the first output terminal, or between the source or drain electrode of the transistor connected to the second output terminal and the gate electrode of the transistor connected to the second output terminal.

The invention also provides a switching circuit device that includes a first set of field effect transistors connected in series and formed on a chip, a second set of field effect transistors connected in series and formed on the chip, a common input terminal connected to a source electrode or a drain electrode of a transistor positioned at one end of the first set and connected to a source electrode or a drain electrode of a transistor positioned at one end of the second set, a first output terminal connected to a source electrode or a drain electrode of a transistor positioned at other end of the first set, a second output terminal connected to a source electrode or a drain electrode of a transistor positioned at other end of the second set, a first control terminal connected to gate electrodes of all the transistors of the first set, a second control terminal connected to gate electrodes of all the transistors of the second set, and a plurality of electrode pads formed on the chip. Each of the electrodes pads are connected to one of the terminals. The device also includes a high impurity concentration region formed at a periphery of each of the electrode pads. The electrode pad connected to the common input terminal and the electrode pad connected to a gate electrode of the transistor positioned at the one end of the first or second set are disposed at both sides of and adjacent a narrow insulating region, or the electrode pad connected to the first or second output terminal and the electrode pad connected to a gate electrode of a corresponding transistor positioned at the other end of the first or second set are disposed at both sides of and adjacent another narrow insulating region.

The invention further provides a switching circuit device that includes a series of field effect transistors formed on a substrate and connected in series, an input electrode pad disposed on the substrate and connected to a source electrode or a drain electrode of a transistor positioned at one end of the series, an output electrode pad disposed on the substrate and connected to a source electrode or a drain electrode of a transistor positioned at other end of the series, a first control electrode pad disposed on the substrate and connected to a gate electrode of the transistor at the one end of the series, and a second control electrode pad disposed on the substrate and connected to a gate electrode of the transistor at the other end of the series. The second control electrode pad is connected to the first control electrode pad. The device also includes a high impurity concentration region formed in the substrate and at a peripheral portion of each of the electrode pads. The input electrode pad and the first control electrode pad are disposed so that the high impurity concentration regions of the input electrode pad and the first control electrode pad face each other and are separated by a first thin portion of the substrate, or the output electrode pad and the second control electrode pad are disposed so that the high impurity concentration regions of the output electrode pad and the second control electrode pad face each other and are separated by a second thin portion of the substrate.

DETAILED DESCRIPTION OF THE INVENTION

Figure 1A:
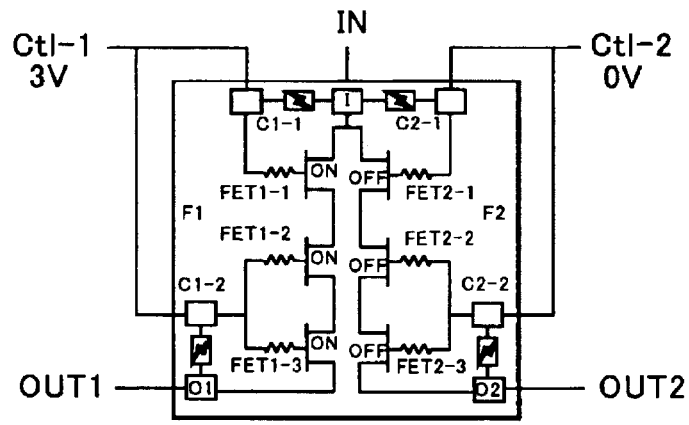
FIGS. 1A–1C are circuit diagrams of a semiconductor device of s first embodiment of this invention.
Figure 1B:
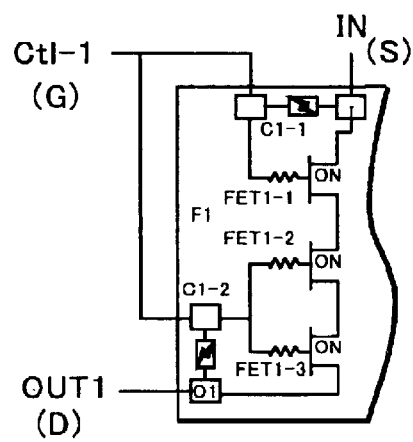

FIGS. 1A and 1B are circuit diagrams showing an example of compound semiconductor switching circuit device of a first embodiment of this invention. The region surrounded by the rectangle indicates a chip. As shown in FIG. 1A, the switching circuit device includes a first FET set F1 and a second FET set F2, in each of which three FETs are connected serially. A source electrode (or drain electrode) of an FET at one end of the first FET set F1 and a source electrode (or drain electrode) of an FET at one end of the second FET set F2 are connected to a common input terminal IN. Also, gate electrodes of the three FETs of the first FET set F1 are respectively connected via resistors to a common first control terminal Ctl-1 and three gate electrodes of the second FET set F2 are respectively connected via resistors to a second control terminal Ctl-2. Furthermore, a drain electrode (or source electrode) of the FET at the other end of the first FET set F1 is connected to a first output terminal OUT1 and a drain electrode (or source electrode) of the FET at the other end of the second FET set F2 is connected to a second output terminal OUT2. The control signals that are applied to the first and second control terminals Ctl-1 and Ctl-2 are complementary signals and the circuit operation is such that the FET set, to which a H level signal is applied, turns ON and transmits an input signal applied to the common input terminal IN to one of the output terminals. The resistors are disposed for the purpose of preventing the leakage of high-frequency signals from the gate electrodes to the first and second control terminals Ctl-1 and Ctl-2, which are DC potentials, that is, AC grounded.

At the periphery of the chip are disposed electrode pads I, O1, and O2, which are respectively connected to the common input terminal IN, the first output terminal OUT1, and the second output terminal OUT2, the electrode pads C1-1 and C1-2, which are connected to the first control terminal Ctl-1, and the electrode pads C2-1 and C2-2, which are connected to the second control terminal Ctl-2.

FIG. 1B is a circuit diagram of the first FET set F1. A circuit diagram of the second FET set F2 is designed in the same manner. As illustrated, with the FET set F1, in which multiple stages are connected serially, the source electrode of FET1-1 is connected as a source S of the FET set F1 to the common input terminal IN, the respective gate electrodes of FET1-1, FET1-2, and FET1-3 are connected in common, as a gate G of the FET set F1, to the first control terminal Ctl-1, and the drain electrode of FET1-3 is connected as a drain D of the FET set F1 to the first output terminal OUT1.

With the present embodiment, inside the chip, the gate G of the FET set F1 is divided into a group containing the gate electrode of FET1-1, which is the FET at one end of the FET set F1, and a group containing the gate electrode of FET1-3, which is the FET at the other end of the FET set F1, and these groups are connected respectively to the two control terminal pads C1-1 and C1-2. Specifically, the gate electrode of FET1-1 is connected to the control terminal pad C1-1, the gate electrodes of FET1-2 and FET1-3 are connected to the control terminal pad C1-2, and both of the two electrode pads C1-1 and C1-2 are connected outside the chip to the first control terminal Ctl-1.

Also, the gate G of the FET set F2 is divided into a group containing the gate electrode of FET2-1, which is the FET at one end of the FET set F2, and a group containing the gate electrode of FET2-3, which is the FET at the other end of the FET set F2, and these groups are connected respectively to the two control terminal pads C2-1 and C2-2. Specifically, the gate electrode of FET2-1 is connected to the control terminal pad C2-1, the gate electrodes of FET2-2 and FET2-3 are connected to the control terminal pad C2-2, and both electrode pads C2-1 and C2-2 are connected outside the chip to the second control terminal Ctl-2 (see FIG. 1A).

Furthermore, by positioning the control terminal pads C1-1 and C2-1 near the input terminal pad I and positioning the control terminal pads C1-2 and C2-2 near the output terminal pads O1 and O2, an layout wherein protecting elements 200 are connected in the respective interval spaces is realized.

Figure 1C:
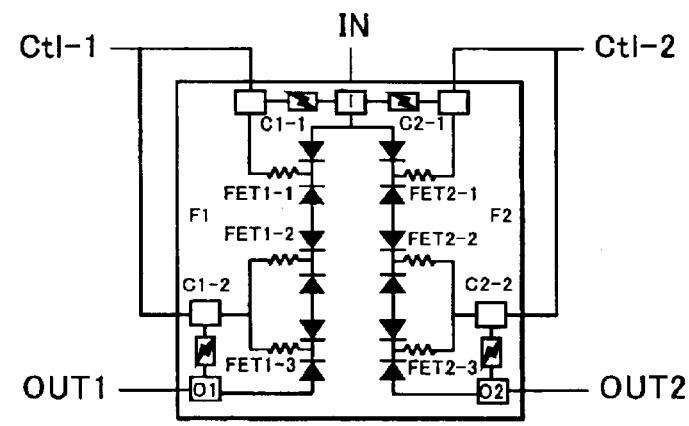

FIG. 1C is a diagram in which the FET parts in FIG. 1A have been replaced by internal equivalent circuits. When considering the electrostatic breakdown voltage in a switching circuit device, the gate Schottky junctions are put in reverse bias states. Thus the equivalent circuit for this case is a circuit wherein a Schottky barrier diodes 115 are connected between the gate electrode and source electrode and between the gate electrode and drain electrode.

Here, the communications between the common input terminal IN and the first control terminal Ctl-1, between the common input terminal IN and the second control terminal Ctl-2, between the first control terminal Ctl-1 and the first output terminal OUT1, and between the second control terminal Ctl-2 and the second output terminal OUT2 correspond to the communications between the source electrode and the gate electrode of FET1-1, the source electrode and the gate electrode interval of FET2-1, the gate electrode and the drain electrode interval of FET1-3, and the gate electrode and the drain electrode interval of FET2-3, respectively.

That is, with the gate Schottky junctions of the respective FETs at the ends at one side and the other side (the Schottky barrier diodes 115 at the ends at one side and the other side) of the FET sets F1 and F2 in such a multiple-stage connection switching circuit device, both the anodes and cathodes are lead out to the exterior as the common input terminal IN, the first and second control terminals Ctl-1 and Ctl-2, and the first and second output terminals OUT1 and OUT2.

When both the anodes and cathodes of the gate Schottky junctions are thus lead out to the exterior, electrostatic energy is received directly from the anodes and cathodes and thus the layout will have the problem of being extremely weak against electrostatic breakdown. If, on the other hand, the anodes and cathodes are lead out to the exterior after being connected to another FET, or such element as the gate Schottky junctions that are positioned in between, since a part of the electrostatic energy is first consumed as thermal energy by the junctions of the other elements, etc., and the remaining electrostatic energy is received, the received electrostatic energy will be lessened and electrostatic breakdown will be less likely to occur.

For protection against electrostatic breakdown, the electrostatic energy that is applied to the Schottky junctions of the gate electrodes, which are weak junctions, should be decreased. Thus with this embodiment, the protecting elements 200 are connected between the source electrode and the gate electrode of FET1-1, between the source electrode and the gate electrode of FET2-1, between the gate electrode and the drain electrode of FET1-3, and between the gate electrode and the drain electrode of FET2-3, which undergo electrostatic breakdown readily due to both the anodes and cathodes of the gate Schottky junctions being lead out to the exterior, and by thus providing paths that serve as bypasses for partial discharge of electrostatic energy applied between the two electrodes, the junctions that are weak against electrostatic breakdown are protected.

Figure 2:
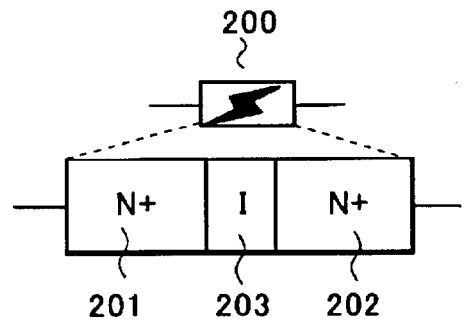
FIG. 2 is a schematic view of a protecting element of the device of FIG. 1A.

Herein, the protecting element 200 will be described by use of FIG. 2, which is a schematic diagram showing the protecting element 200. The protecting element 200 is an element in which an insulating region 203 is disposed between a first high concentration impurity region 201 and a second high concentration impurity region 202 that are disposed close to each other. The first and second high concentration impurity regions 201 and 202 are formed by ion implantation or diffusion in a substrate 101. These high concentration impurity regions shall be described hereinafter as a first $n^+$-type region 201 and a second $n^+$-type region 202. The first and second $n^+$-type regions 201 and 202 are separated by a distance that enables passage of electrostatic energy, for example, a distance of approximately 4 $\mu$m, and for both, the impurity concentration is $1 \times 10^{17}$ cm$^{-3}$ or more. The insulating region 203 is disposed in contact between the first and second $n^+$-type regions 201 and 202. Here, the insulating region 203 may not be an electrically complete insulator but may be a part of a semi-insulating substrate or an insulating region formed by ion implantation of an impurity into the substrate 201. The insulating region 203 preferably has an impurity concentration of $1 \times 10^{14}$cm$^{-3}$ or less and a resistivity of $1 \times 10^3 \Omega$·cm or more.

By disposing the first and second n+-type regions 201 and 202 in contact with the respective ends of the insulating region 203 and making the distance between the first and second n+-type regions 201 and 202 approximately 4 $\mu$m, electrostatic energy, which is applied from the outside between two electrodes of the protected element (switching circuit device) to which the first and second n+-type regions 201 and 202 are respectively connected, can be discharged via the insulating region 203.

The distance of 4 $\mu$m between these two $n^+$-type regions is a suitable distance for passage of electrostatic energy, and with a distance of 10 $\mu$m or more, discharge will not occur reliably between these two $n^+$-type regions of the protecting element. The same applies to impurity concentration of n+-type region.

Under normal FET operation, since a voltage as high as that of static electricity is applied, a signal does not pass through the insulating region of 4 $\mu$m. Likewise, a signal does not pass through the insulating region of 4 $\mu$m even in the case of high-frequency operation, such as microwave. Thus, under normal operation, the protecting element does not change device characteristics at all since it does not influence the characteristics of the FET in any way. However, static electricity is a phenomenon in which a high voltage is applied instantaneously, and in this case, electrostatic energy passes through the insulating region of 4 $\mu$m and is discharged between two n+-type regions. Also, when the thickness of the insulating region becomes 10 $\mu$m or more, the resistance becomes large even for static electricity and discharge becomes less likely to occur.

The first n+-type region 201 and the second n+-type region 202 are connected between the source electrode and the gate electrode and between the gate electrode and the drain electrode of the FETs of the switching circuit device with which both the anodes and cathodes of the gate Schottky junctions are lead out to the exterior. The first and second n+-type regions 201 and 202 may be used as the terminals of protecting elements 200 as they are, or metal electrodes 204 may be provided additionally.

FIGS. 3A–3D shows cases where the metal electrodes 204 are provided. The structures shown in the figure may be considered for connection with the metal electrodes 204.

Figure 3A:
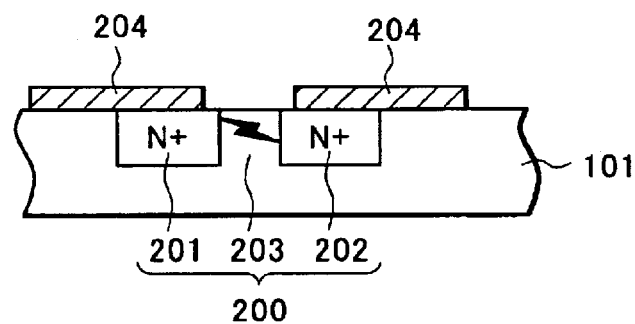
FIGS. 3A–3D are sectional views of the device of FIG. 2.

In FIG. 3A, the metal electrodes 204 form Schottky junctions with the surfaces of the first $n^+$-type region 201 and/or the second $n^+$-type region 202. The electrodes are formed on the surfaces of the first and second $n^+$-type regions 201 and 202 are separated by 0.1 $\mu$m to 5 $\mu$m from the insulating region 203 ends in consideration of the mask aligning accuracy and the resistances of both of the first and second $n^+$-type regions 201 and 202. An separation of 5 $\mu$m or more will make the resistance large and will not readily allow the passage of static electricity. The metal electrodes 204 may be formed on just the first and second $n^+$-type regions 201 and 202 or a part thereof may extend to the semi-insulating substrate 101 and form a Schottky junction with the substrate surface.

Figure 3B:
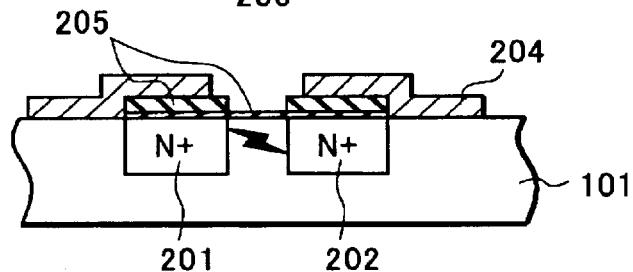
Figure 3C:
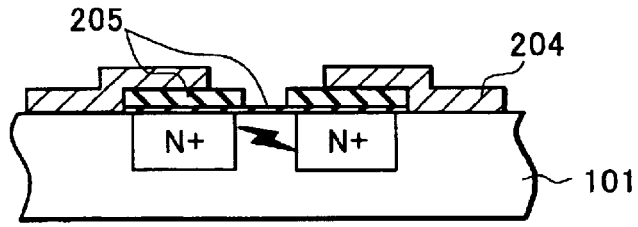

Or as shown in FIGS. 3B and 3C, the metal electrodes 204 may be disposed on passivation nitride films or other insulating films 205 on the first and second $n^+$-type regions 201 and 202. In this case, the metal electrodes 204 are extended onto the semi-insulating substrate 101 and are connected via the substrate 101 to the first and second $n^+$-type regions 201 and 202. Furthermore, as shown in FIG. 3D, a structure, wherein a metal layer is not formed on either of the first and second $n^+$-type regions 201 and 202 but the metal electrodes 204 form Schottky junctions with the semi-insulating substrate 101 at the outer sides of these regions, is also possible.

Figure 3D:
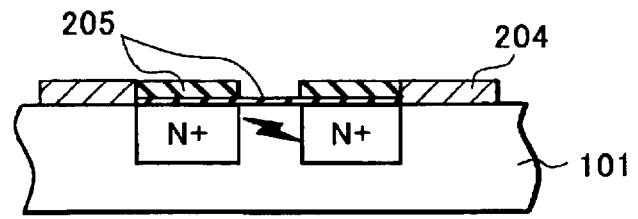

In all of the cases illustrated in FIGS. 3B, 3C, and 3D, the metal electrodes 204 are not connected directly with the first and/or second $n^+$-type regions 201 and 202. The metal electrodes 204 may thus have structures that form Schottky junctions with the substrate approximately 0 $\mu$m to 5 $\mu$m to the outer side from the ends of the first and/or second $n^+$-type regions 201 and 202. That is, as shown in FIGS. 3B, 3C, and 3D, the first and second $n^+$-type regions 201 and 202 do not have to be in contact with the metal electrodes 204, and within a distance of 5 $\mu$m, an adequate connection between the $n^+$-type regions and the metal electrodes 204 can be secured via the semi-insulating substrate.

Moreover, although illustration is omitted, the metal electrodes 204 may form Ohmic junction with the first and second n+-type regions 201 and 202.

Furthermore, the FET may be a MESFET, a junction type FET, or HEMT.

Figure 4:
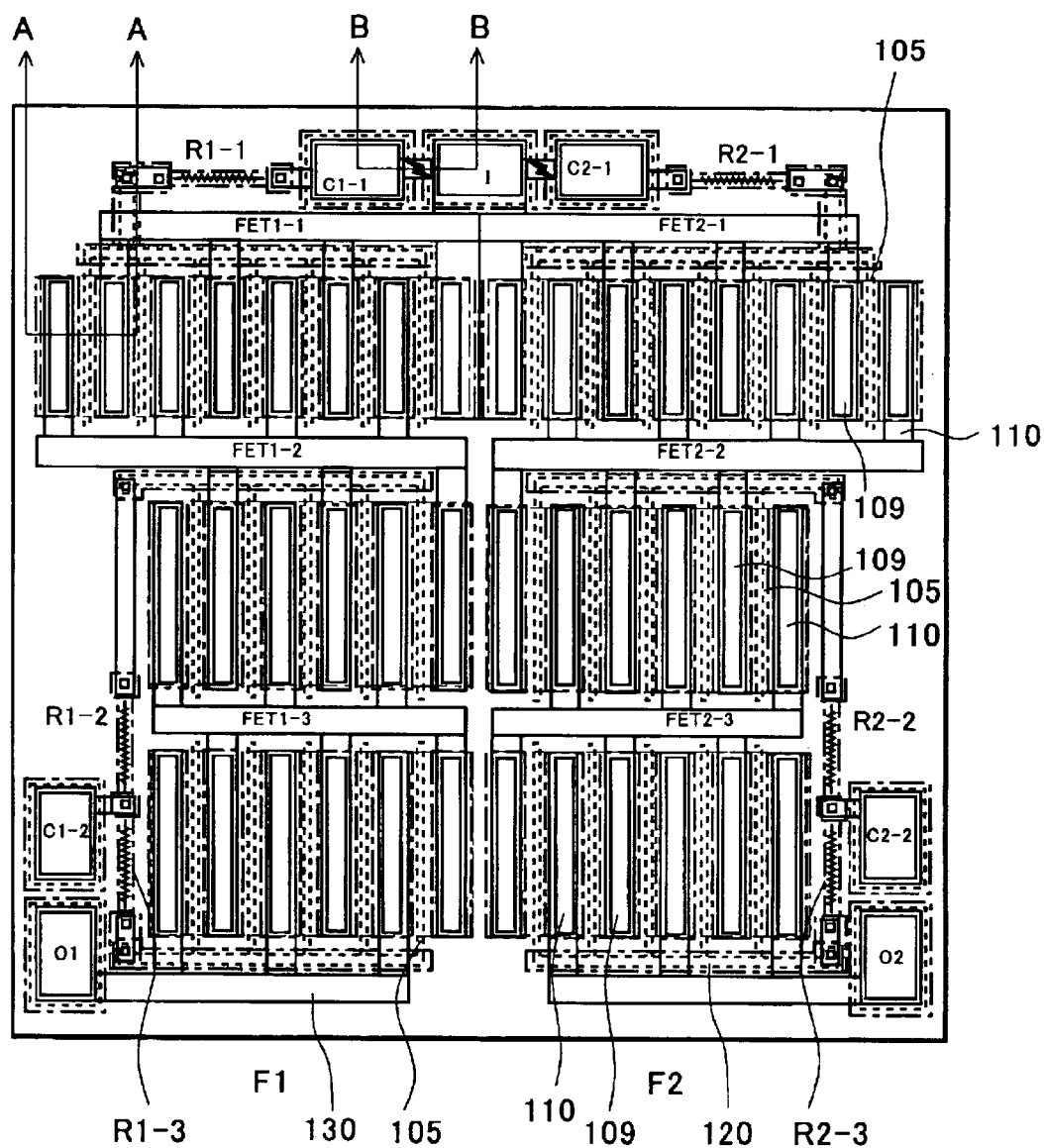
FIG. 4 is a plan view of the device of the first embodiment.

FIG. 4 shows a plan view of the chip shown in FIG. 1. The FET set F1 and the FET set F2 for performing switching are disposed on a GaAs substrate. The FET set F1 has, for example, the three FETs of FET1-1, FET1-2, and FET1-3 connected in series. The FET set F2 has FET2-1, FET2-2, and FET2-3 connected in series. Resistors R1-1, R1-2, R1-3, R2-1, R2-2, and R2-3 are respectively connected to the six gate electrodes that make up the respective FET sets. Also, the electrode pads I, O1 and O2, respectively connecting to the common input terminal IN, the first and second output terminals OUT1 and OUT2, and the electrode pads C1-1 and C1-2, and C2-1 and C2-2, respectively connecting to the first and second control terminals Ctl-1 and Ctl-2 are disposed at the periphery of the substrate. The second-metal layer wiring, indicated by dotted lines, is a gate metal layer (Ti/Pt/Au) 120, formed at the same time the gate electrodes of the respective FETs are formed, and the third-metal layer wiring, indicated by solid lines, is a pad metal layer (Ti/Pt/Au) 130 for connection of the respective elements and pad formation. A first-metal layer as ohmic metal layer (AuGe/Ni/Au), which forms ohmic contact with the substrate, forms the source electrodes and drain electrodes of the respective FETs and forms the lead-out electrodes at both ends of the respective resistors, and is not illustrated in FIG. 4 since it overlaps with the pad metal layer.

Since the FET set F1 and the FET set F2 are positioned symmetrically with respect to the central line of the chip and are the same in layout, the FET set F1 shall be described below. With FET1-1, a four-teeth-comb-shaped third-metal layer pad metal layer 130 parts, which extend from the upper side, comprise the source electrode 109 (or drain electrode) connected to the common input terminal pad I, and below this is disposed a source electrode 106 (or drain electrode) formed by the first-metal layer ohmic metal layer. Also, the four-teeth-comb-shaped third-metal layer pad metal layer 130 parts, which extend from the lower side, comprise the drain electrode 110 (or source electrode) of FET1-1, and below this is disposed a drain electrode 107 (or source electrode), formed by the first-metal layer ohmic metal layer. These electrodes are disposed in the form of engaged comb teeth and in between these, a gate electrode 105, formed of a second and metal layer gate metal layer 120, is disposed in the form of seven comb teeth.

Channel regions are disposed below the parts at which the source electrode 109, the drain electrode 110, and the gate electrode 105 are disposed and these become the operating regions of FET1-1.

With FET1-2, the three comb teeth of the source electrode 109 (or drain electrode) that extend from the upper side are connected to the drain electrode 110 of FET1-1. Here, since this electrode is simply a passage point for high-frequency signals and generally does not require to be lead out to the exterior, an electrode pad is not provided. Also, the three comb teeth of the drain electrode 110 (or source electrode) that extend from the lower side are connected to the source electrode 109 of FET1-3. Since this electrode is likewise simply a passage point for high-frequency signals and generally does not require to be lead out to the exterior, an electrode pad is not provided. The first-metal layer ohmic metal layer is disposed below these electrodes. These are disposed in the form of engaged comb teeth and in between these, the gate electrode 105, formed of the second-metal layer gate metal layer 120, is disposed in the form of five comb teeth. In comparison to a switching circuit device with just one FET, a switching circuit device in which FETs are serially connected in multiple stages can withstand a greater voltage when an FET set is OFF and can thus become a high-output switching circuit device. In this case, the source electrode or drain electrode of an FET, which becomes a connection point in connecting the FETs in series, does not require to be lead out to the exterior and thus do not require an electrode pad.

With FET1-3, the three-teeth-comb-shaped third-metal layer pad metal layer 130 parts, which extend from the upper side, comprise the source electrode 109 (or drain electrode), and below this is disposed the source electrode 106 (or drain electrode) formed by the first-metal layer ohmic metal layer. Also, the three-teeth-comb-shaped third-metal layer pad metal layer 130 parts, which extend from the lower side, comprise the drain electrode 110 (or source electrode) that is connected to the output terminal pad O1, and below this is disposed the drain electrode 107 (or source electrode), formed by the first-metal layer ohmic metal layer. These electrodes are disposed in the form of engaged comb teeth and in between these, the gate electrode 105, formed of the second-metal layer gate metal layer 120, is disposed in the form of five comb teeth.

Figure 11:
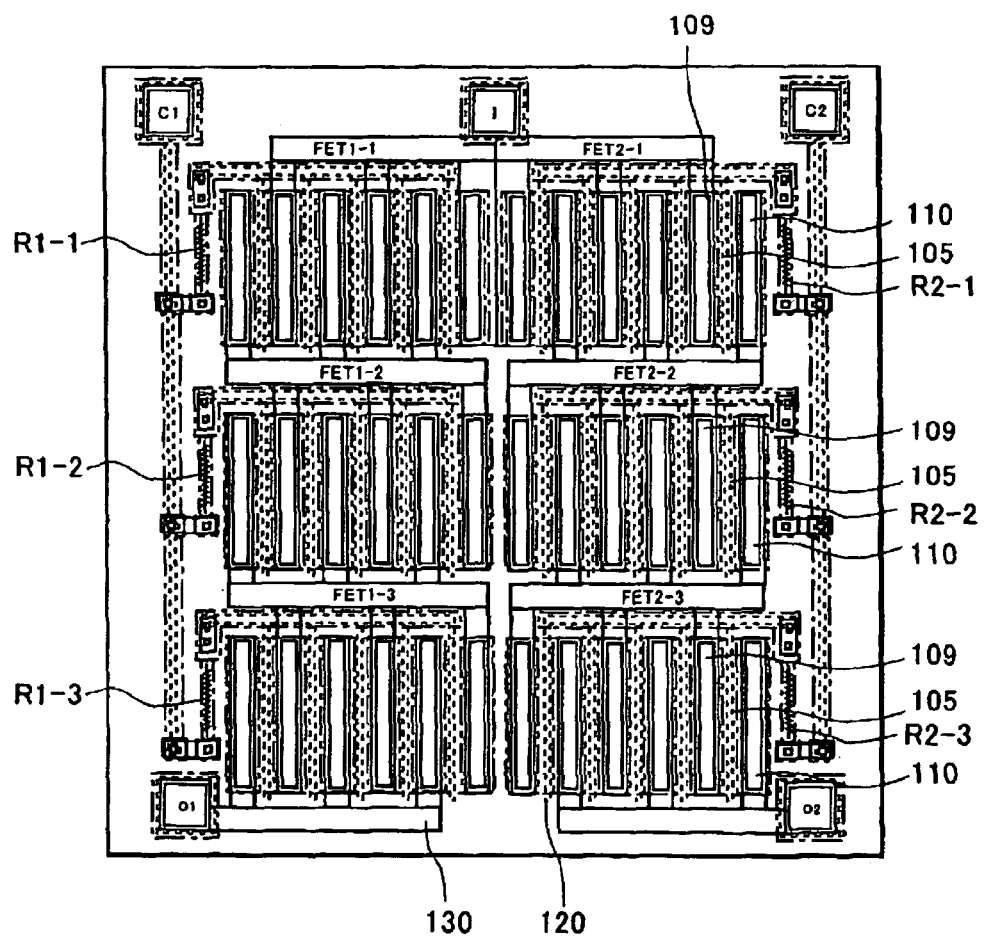
FIG. 11 is a plan view of the device of FIG. 10A.
Figure 12:
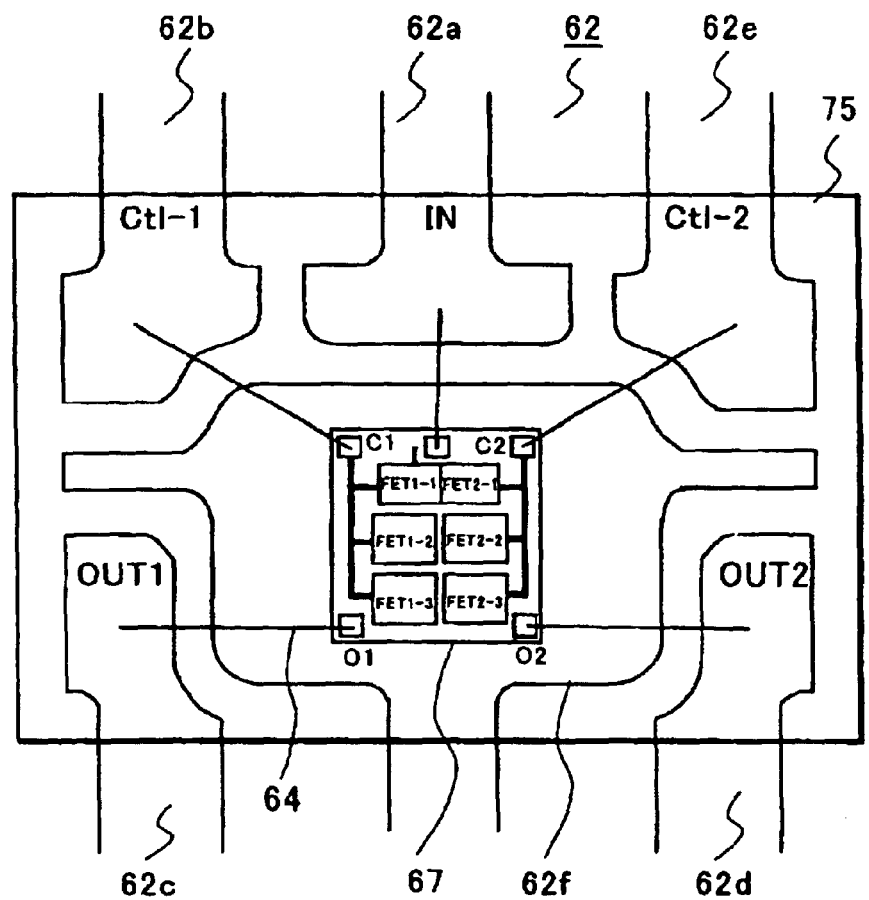
FIG. 12 is another plan view of the device of FIG. 10A.

In the multistage switching circuit device shown in FIG. 11, each of the first and second control terminals Ctl-1 and Ctl-2 has one electrode pad on the chip connected thereto and from these electrode pads C1 and C2, connection means that include resistors are extended to the gate electrodes of the respective FETs making up the respective FET sets.

With this embodiment, since the two electrode pads C1-1 and C1-2 are provided as the control terminal pads connecting to the first control terminal Ctl-1, the gate G of the FET set F1 is divided into the group containing the gate electrode of FET1-1, located at one end of the FET set F1, and the group containing the gate electrode of FET1-3, located at the other end of the FET set F1. These gate electrodes are connected to the two control terminal pads C1-1 and C1-2 and both of the control terminal pads are connected to the first control terminal Ctl-1 outside the chip. Specifically, a connection means, including the resistor R1-1, is connected from the gate electrode of FET1-1 to the control terminal pad C1-1, and connection means, respectively including the resistors R1-2 and R1-3, are connected from the respective gate electrodes 105 of FET1-2 and FET1-3 to the control terminal pad C1-2.

The same applies likewise to the FET set F2 side, and the resistor R2-1 is extended from the control terminal pad C2-1 and connected to the gate electrode 105 of FET2-1, and the resistors R2-2 and R2-3 are extended from the control terminal pad C2-2 and connected to the respectivegate electrodes 105 of FET2-2 and FET2-3. The reason why a plurality of the electrode pads connecting to a single control terminal are provided shall be explained later.

The resistors R are n+-type impurity diffused regions disposed on the substrate. Each of the resistor R1-1, R1-2, R1-3, R2-1, R2-2, and R2-3 has a resistance value of 10 KΩ.

Figure 5A:
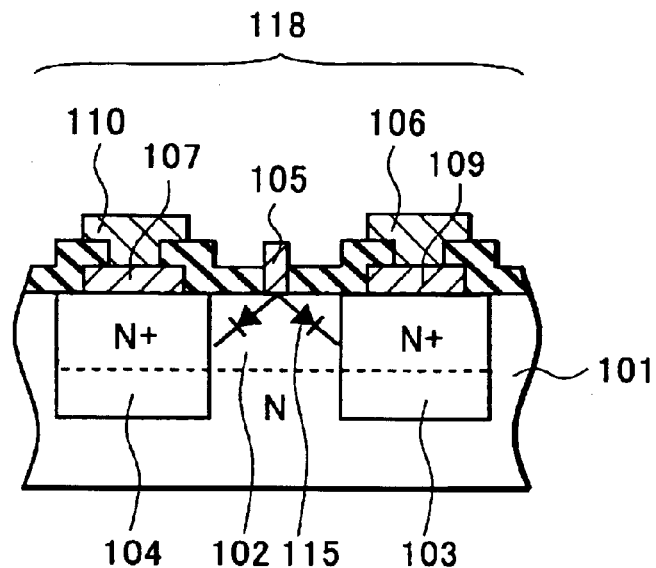
FIG. 5A is a sectional view.
Figure 5B:
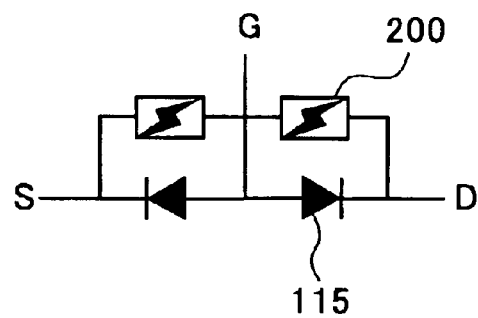
FIG. 5B is an equivalent circuit diagram and FIG. 5C is a sectional view of the protecting element of FIG. 2.
Figure 5C:
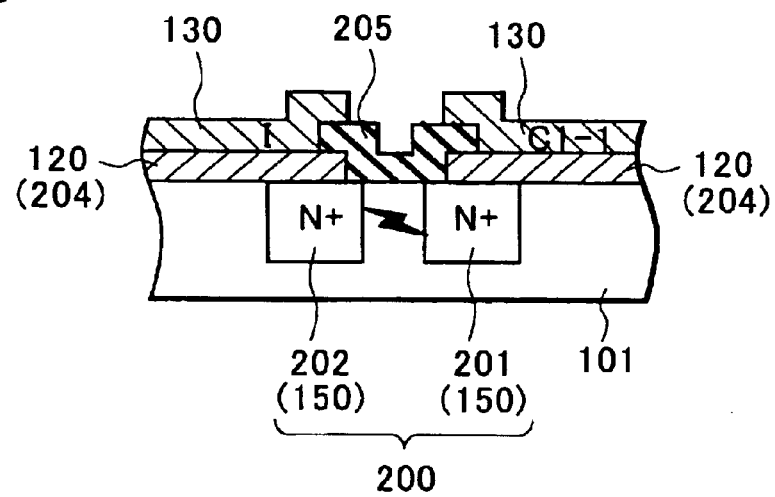

FIGS. 5A–5C show sectional views and an equivalent circuit diagram of a part of the switching circuit device shown in FIG. 4. FIG. 5A is a sectional view along line A—A of FIG. 4 and shows a single FET. FIG. 5B is a equivalent circuit diagram of FIG. 5A, and FIG. 5C is a sectional view along line B—B of FIG. 4 and shows the vicinity of the electrode pads. All six FETs and the electrode pads making up the switching circuit device have the same structure.

As shown in FIG. 5A, on the substrate 101, an n-type operating layer 102 is disposed, n+-type impurity regions, forming a source region 103 and a drain region 104, are disposed at the respective sides of the operating layer, the gate electrode 105 is disposed on the operating layer 102, and the drain electrode 107 and the source electrode 106, each formed of the first-metal layer ohmic metal layer, are disposed on the impurity regions. Furthermore on top, the drain electrode 110 and the source electrode 109, formed of the third-metal layer pad metal layer 130 as mentioned above, are disposed and the wiring, etc., of the respective elements are provided. The region, in which the drain electrode 110, the source electrode 109, and the gate electrode 105 are disposed in comb-like form, shall be referred to as an operating region 118.

FIG. 5B shows an equivalent circuit for considering the electrostatic breakdown phenomenon of a MESFET. Though the equivalent circuit diagram of the entire switching circuit device is shown in FIG. 1C, in terms of the sectional structure of an FET, the phenomenon can be considered with this figure. That is, the state that is weakest in terms of electrostatic breakdown is the state in which a surge voltage is applied when the gate electrode side of a gate electrode—source electrode junction or gate electrode—drain electrode junction is set to negative, that is, when the gate Schottky junction of small capacitance value that is formed at the interface between the operating region 118 and the gate electrode 105, formed on a surface of the operating region 118, is set to a reverse bias state.

That is, if, when the electrostatic energy that is applied between the gate electrode and the drain electrode or between the gate electrode and the source electrode reaches the gate Schottky junction, the electrostatic energy that reaches the junction exceeds the electrostatic breakdown voltage between the gate electrode and the drain electrode or between the gate electrode and the source electrode, the gate Schottky junction undergoes electrostatic breakdown.

As shown in FIG. 1C, the switching circuit device of this embodiment has the circuit design in which a plurality of Schottky barrier diodes are connected and since the Schottky barrier diodes at one end and the other end, with each of which both the anode and cathode are lead out to the exterior, directly receive the electrostatic energy that is applied from the exterior, these Schottky barrier diodes undergo electrostatic breakdown readily.

Thus with this embodiment, the protecting elements 200 are connected between the source electrode and the gate electrode or between the gate electrode and the drain electrode of the FETs, which, among the FETs of the switching circuit, undergo electrostatic breakdown readily due to both the anode and cathode of the gate Schottky junction being lead out to the exterior, in other words, FET1-1 and FET1-3 or FET2-1 and FET2-3, which are the FETs at the ends of the FET sets. The two-electrodes pairs correspond to the pairs of the common input terminal IN and the first control terminal Ctl-1, of the common input terminal IN and the second control terminal Ctl-2, of the first control terminal Ctl-1 and the first output terminal OUT1, and of the second control terminal Ctl-2 and the second output terminal OUT2. Paths serving as bypasses are thereby provided for partially discharging the electrostatic energy that is applied between these two electrodes. The electrostatic energy applied to the FET gate Schottky junctions that are weak junctions can thereby be lessened (see FIG. 4).

Here, as shown in FIG. 5C, a pad peripheral n+-type regions 150 are disposed at the peripheries of the electrode pads(pad metal layer) 130 as an isolation measure for preventing the leakage of high-frequency signals from the respective electrode pads. The lowermost gate metal layers 120 below the respective electrode pads 130 form Schottky junctions with the GaAs semi-insulating substrate and the pad peripheral n+-type regions 150 form Schottky junctions with the respective electrode pads as well.

Parts of the pad peripheral n+-type regions 150 thus form the protecting element 200 across the semi-insulating substrate 101. Also, the metal electrodes 204 form Schottky junctions with the pad peripheral n+-type regions 150. In this case, the metal electrode 204 is a part of the common input terminal pad 1, the output terminal pad O1 or O2, or the control terminal pad C1-1, C2-1, C1-2, or C2-2, which is formed of the gate metal layer 120.

By thus positioning the pad peripheral n+-type regions 150 at the peripheries of the electrode pads and positioning the electrode pad connected to the control terminal Ctl-1 or Ctl-2 near the electrode pad I, O1, or O2, which is connected to the common input terminal IN or the first output terminal OUT1 or the second output terminal OUT2, the protecting elements 200 are connected at the corresponding portions. Each of the first and second control terminals Ctl-1 and Ctl-2 is thus provided with and connected to the two control terminal pads where C1-1 and C2-1 are disposed near the common input terminal pad I and C1-2 and C2-2 are disposed near output terminal pads O1 and O2, respectively.

The pad peripheral n+-type region 150 may be disposed at the entire surface part below the electrode pad so that the peripheral part thereof protrudes from the electrode pad or disposed just at a peripheral part.

Here, since the FET set F1 side and the FET set F2 side are symmetrical and completely the same, the FET set F1 side shall be described as an example. As mentioned above, in order to protect a switching circuit device from electrostatic breakdown, it is sufficient that the electrostatic energy be attenuated before the electrostatic energy is applied between the source electrode and the gate electrode of FET1-1, i.e., between the common input terminal IN and the first control terminal Ctl-1, or between the gate electrode and the drain electrode of FET1-3, i.e., between the first control terminal Ctl-1 and the first output terminal OUT1. It is more effective for the electrostatic energy to be attenuated in the process of reaching these electrodes pairs.

Though the method of increasing the resistance value of the resistor R1 may be considered as a method of attenuating the electrostatic energy, if the resistor R1 is made too large, the switching time of the switching circuit device becomes too long. Thus with this embodiment, the electrostatic energy is attenuated by the use of the protecting elements 200.

Here, by positioning the control terminal pad C1-1 near the common input terminal pad I, the distance between the pad peripheral n+-type regions 150 becomes 4 μm and the protecting element 200 is formed across the semi-insulating substrate 101. This is thus equal to connecting the protecting element 200 between the common input terminal IN and the first control terminal Ctl-1, that is, between the source electrode and the gate electrode (or between the drain electrode and the gate electrode) of FET1-1.

The above structure connects the protecting element 200 at an upstream position of the path by which the static electricity that is applied between the common input terminal pad I and the control terminal pad C1-1 is transmitted between the source electrode and gate electrode on the operating region of FET1-1. The electrostatic energy that is applied to the switching circuit device from the exterior can thus be attenuated at the early stage of the energy transmission to the corresponding electrode pad of the chip Likewise, by positioning the control terminal pad C1-2 near the output terminal pad O1, the distance between the pad peripheral n+-type regions 150 becomes 4 μm and the protecting element 200 is formed across the semi-insulating substrate 101. This is thus equal to connecting the protecting element 200 between the first output terminal OUT1 and the first control terminal Ctl-1, that is, between the drain electrode and the gate electrode (or between the source electrode and the gate electrode) of FET1-3.

This structure also connects the protecting element 200 at an upstream position of the path by which the static electricity that is applied between the output terminal pad O1 and the control terminal pad C1-2 and transmitted between the drain electrode and the gate electrode on the operating region 118 of FET 1-3. The electrostatic energy that is applied to the switching circuit device from the exterior can thus be attenuated at the early stage of the energy transmission as well.

The electrostatic energies that are applied between the first output terminal OUT1 and the first control terminal Ctl-1 and between the common input terminal IN and the first control terminal Ctl-1 can thus be respectively attenuated to the same degree and most efficiently at the initial stages in the path, thereby enabling the prevention of electrostatic breakdown of the corresponding gate Schottky junctions between the drain electrode and the gate electrode of FET1-3 and between the source electrode and the gate electrode of FET1-1.

Figure 6A:
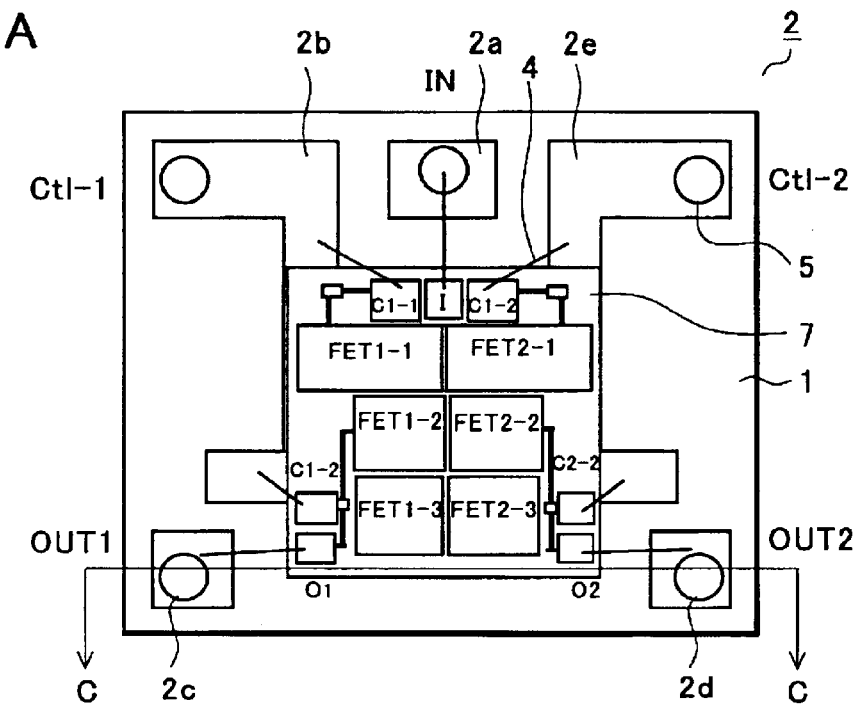
FIGS. 6A and 6B are plan views of the device of the first embodiment.
Figure 6B:
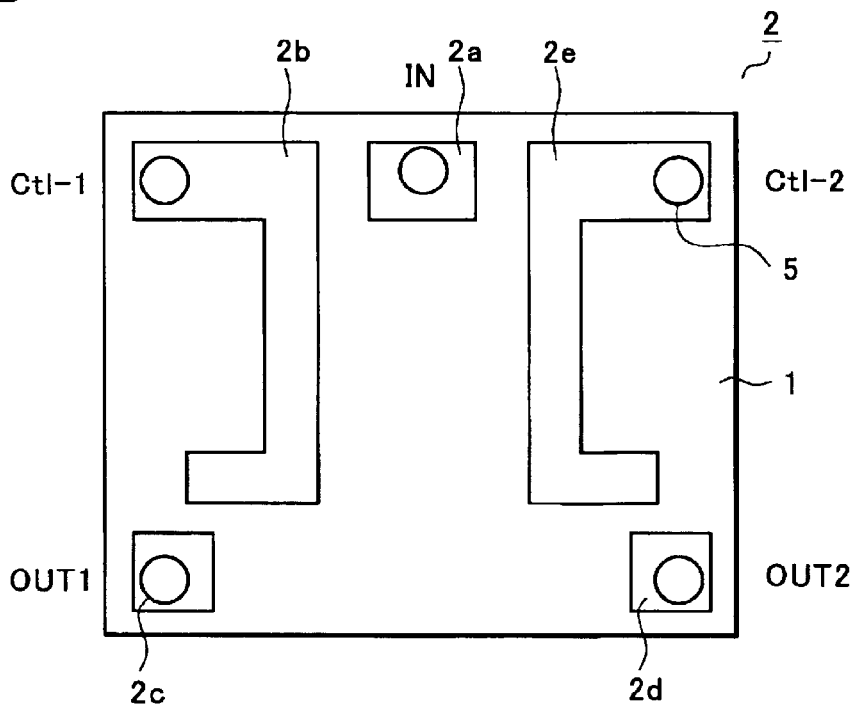

FIGS. 6A and 6B show an example in which a semiconductor chip 7 of the switching circuit device of FIG. 1, is assembled. With this embodiment, the above-described switching circuit device is assembled in a chip-size package. FIG. 6A is a plan view showing the manner in which the chip is assembled in a package 15 and FIG. 6B is a plan view showing the conductive patterns.

As shown in FIG. 6A, a substrate 1 is an insulating substrate, formed of ceramics, a glass an epoxy resin, etc., and which is a single substrate or a plurality of such substrates piled up so that the total substrate thickness is 180 to 250 μm. That is a thickness that can maintain mechanical strength in the manufacturing process.

As illustrated, leads 2, each formed of a gold plating layer, are disposed on the insulating substrate 1. The leads 2a, 2b, 2c, 2d, and 2e are disposed so as to respectively correspond to the common input terminal IN, the first control terminal Ctl-1, the first and second output terminals OUT1 and OUT2, and the second control terminal Ctl-2.

The chip 7 is bonded onto the insulating substrate 1 and connected by means of bonding wires 4 in the followed manner. The leads 2a, 2c, and 2d are respectively connected to the common input terminal pad 1 and the output terminal pads O1 and O2 and thus to the common input terminal IN and the first and second output terminals OUT1 and OUT2. The ends at one side of the leads 2b and 2e are positioned near the control terminal pads C1-1 and C1-2 and the ends at the other side are extended to positions near the control terminal pads C1-2 and C2-2.

The circuit diagram of the package as a whole is thus one in which the first control terminal Ctl-1 is connected to the gate G of the FET set F1 and the second control terminal Ctl-2 is connected to the gate G of the FET set F2, as shown in FIG. 1A.

As shown in FIG. 6B, the leads 2b and 2e, corresponding to the first and second control terminals Ctl-1 and Ctl-2, are extended on the insulating substrate 1 as illustrated. Each of the leads 2 is connected via through holes to external electrodes, which are disposed on a rear surface of the insulating substrate 1 and become the respective terminals. Though the leads 2b and 2e may be positioned below the chip 7 or may be extended away from the chip, for connection of the control terminal pads, parts of these leads are exposed near the control terminal pads. Both of the control terminal pads C1-1 and C1-2 are connected to the lead 2b and connected to the first control terminal Ctl-1, and both of the control terminal pads C2-1 and C2-2 are connected to the lead 2e and connected to the second control terminal Ctl-2.

Figure 7A:
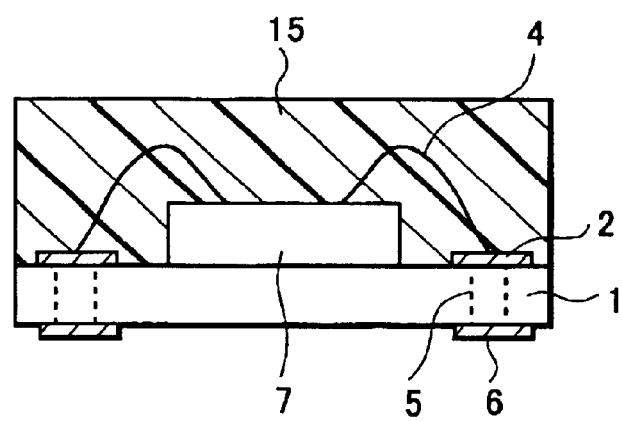
FIGS. 7A is a sectional view and FIG. 7B is a plan view of the device of the first embodiment.
Figure 7B:
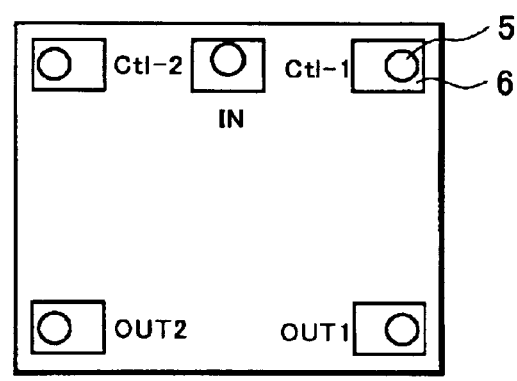

FIG. 7A is a side view of the package of FIG. 6A, and FIG. 7B is a rear view of the package.

As shown in FIG. 7A, the insulating substrate 1 is provided with through holes 5 that correspond to the respective the leads 2. The through holes 5 pass through the insulating substrate 1 and the interiors are filled with tungsten or other conductive material. At the rear surface, external electrodes 6, which become the respective terminals, are provided in correspondence to the respective through holes 5.

The four peripheral side surfaces of the package are formed by cut surfaces of a resin layer 15 and the insulating substrate 1, a top surface of the package is formed by the flattened top surface of the resin layer 15, and a bottom surface of the package is formed by the rear surface side of the insulating substrate 1. This package has a size, for example, of 1.2×1.0 mm².

Furthermore as shown in FIG. 7B, the five external electrodes 6 are, for example, positioned in correspondence to the second control terminal Ctl-2, the common input terminal IN, and the first control terminal Ctl-1 along one side of the package and in correspondence to the first and second output terminals OUT1 and OUT2 at the opposite side of the package.

With this embodiment, for the purpose of connecting the protecting elements 200, the two control terminal pads are respectively provided for and connected to each of the first and second control terminals Ctl-1 and Ctl-2, and the common input terminal pad I and the respective output terminal pads O1 and O2 are positioned near the four control terminal pads. Though these plurality of control terminal pads must be connected respectively to the first and second control terminals Ctl-1 and Ctl-2, they are positioned in a dispersed manner on the chip in order to position them near the common input terminal pad I and the output terminal pads O1 and O2. Thus by assembling the chip of the switching circuit device in a chip-size package and connecting the leads 2b and 2e upon extending them as in this embodiment, a compact package size can be realized even if the control terminal pads connecting to the first and second control terminals Ctl-1 and Ctl-2 are dispersed within the chip.

By connecting the protecting elements 200 between the common input terminal IN and the first control terminal Ctl-1, between the common input terminal IN and the second control terminal Ctl-2, between the first output terminal OUT1 and the first control terminal Ctl-1, and between the second output terminal OUT2 and the second control terminal Ctl-2 of the switching circuit device as described above, the electrostatic breakdown voltages between these terminals, which was approximately 100V with the conventional art when measured at 220 pF and 0Ω, is improved to 700V.

A second embodiment of this invention shall now be described with reference to FIGS. 8A–9B. With this embodiment, inspection terminals are provided in the switching circuit device of the first embodiment.

Figure 8A:
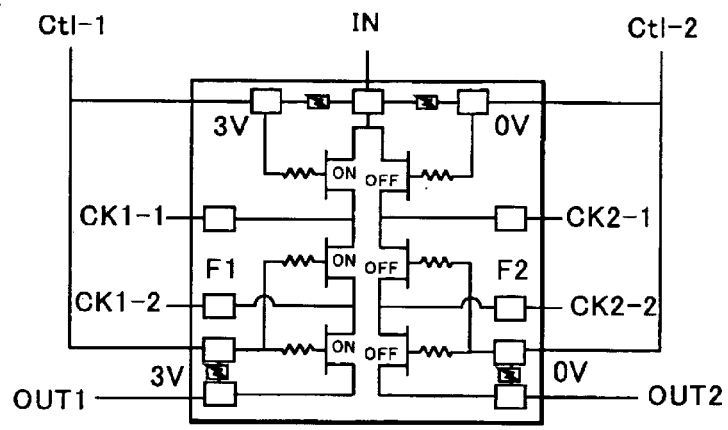
FIG. 8A is a circuit diagram and FIG. 8B is a plan view of a semiconductor device of a second embodiment of the invention.
Figure 8B:
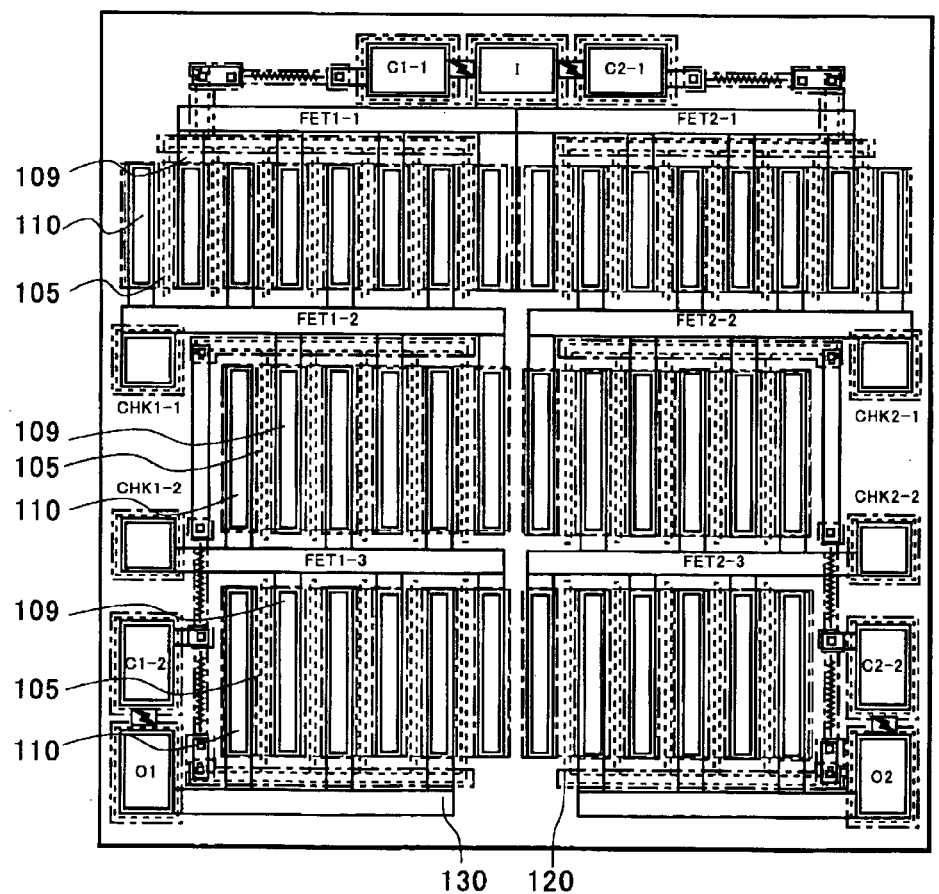

FIGS. 8A and 8B show a switching circuit device of this embodiment. FIG. 8A is a diagram of the switching circuit device. FIG. 8B shows an example of a semiconductor chip in which the part surrounded by a rectangle in FIG. 8A is integrated.

As shown in FIG. 8A, with the switching circuit device of the second embodiment, all source electrodes, gate electrodes, and drain electrodes of all FETs of the FET sets of the switching circuit device of FIG. 1, are lead out to the exterior. The interior of the solid lines is the circuit diagram of the chip.

Here, the common input terminal IN, the first and second control terminals Ctl-1 and Ctl-2, and the first and second output terminals OUT1 and OUT2, which are to be used as parts of the switching circuit device at the user side, shall be referred to as external terminals OT of the switching circuit device. With this embodiment, the electrodes of all FETs are lead out to the exterior, and in addition to the external terminals OT, four inspection terminals, CK1-1, CK1-2, CK2-1, and CK2-2, are provided.

The FET set F1 side shall now be described. The drain electrode (or source electrode) of FET1-1 is connected to the source electrode (or drain electrode) of FET1-2 and these electrodes are connected in common to the inspection terminal CK1-1 and lead out to the exterior. Also, the drain electrode (or source electrode) of FET1-2 is connected to the source electrode (or drain electrode) of FET1-3 and these electrodes are connected in common to the inspection terminal CK1-2 and lead out to the exterior. The source electrode (or drain electrode) of FET1-1 is connected to the common input terminal IN and lead out to the exterior, the drain electrode (or source electrode) of FET1-3 is connected to the first output terminal OUT1 and lead out to the exterior, and the gate electrodes of the three FETs are connected in common to the first control terminal Ctl-1 and lead out to the exterior. The external terminals OT and the inspection terminals CK, connecting to all of the source electrodes, gate electrodes, and drain electrodes of all of the FETs making up the FET set F1, are thus lead out to the exterior of the semiconductor chip. The layout of the FET set F2 is the same as that of the FET set F1 and thus a description thereof shall be omitted.

The semiconductor chip is a multistage switching circuit device in which FETs are serially connected in three stages, and with this embodiment, in order to lead all electrodes out to the exterior, wirings are drawn out from the source electrodes and drain electrodes of FET1-2 and FET2-2 and connected to electrode pads CHK1-1, CHK1-2, CHK2-1, and CHK2-2. These electrode pads are connected to the inspection terminals CK1-1, CK1-2, CK2-1, and CK2-2.

Furthermore, in order to position the protecting elements 200 close to the common input terminal pad I and each of the first and second output terminal pads O1 and O2, the first and second control terminals Ctl-1 and Ctl-2 are provided with the control terminal pads C1-1 and C1-2 and the control terminal pads C2-1 and C2-2, respectively, as in the first embodiment. N+-type high concentration regions are disposed at the peripheries of all of these pads to realize a structure in which the protecting element 200 is connected across the insulating region (substrate 101). The other components are the same as those of the first embodiment and thus detailed description thereof shall be omitted.

Thus with the present embodiment, by leading the electrodes of all of the FETs out to the exterior, complete DC inspections can be performed on each of the FETs. The high-frequency characteristics of the switching circuit device can thus be assured while omitting high-frequency characteristics inspections.

Furthermore, with this switching circuit device, the protecting elements 200 are connected between the common input terminal IN and the first control terminal Ctl-1 and between the first output terminal OUT1 and the first control terminal Ctl-1 and the protecting elements 200 are connected between the common input terminal IN and the second control terminal Ctl-2 and between the second output terminal OUT2 and the second control terminal Ctl-2.

That is, the protecting elements 200 are connected by positioning the common input terminal pad I near the control terminal pads C1-1 and C1-2, positioning the output terminal pad O1 near the control terminal pad C1-2, and positioning the output terminal pad O2 near the control terminal pad C2-2. Thus, in FETs, when static electricity is applied between the common input terminal pad and the respective control terminal pads and between the respective output terminal pads and the respective control terminal pads and when both the anodes and cathodes of the gate Schottky junctions are lead out to the exterior as the external terminals OT, protecting elements are connected at the upstream positions in the paths leading to the pairs of the source electrode and the gate electrode and of the drain electrode and the gate electrode on the operating regions. The electrostatic energy that is applied from the exterior to the switching circuit device can thus be attenuated at the early stage in the path of the energy transmission to the ends of gate Schottky junctions on the operating regions of the FETs.

Figure 9A:
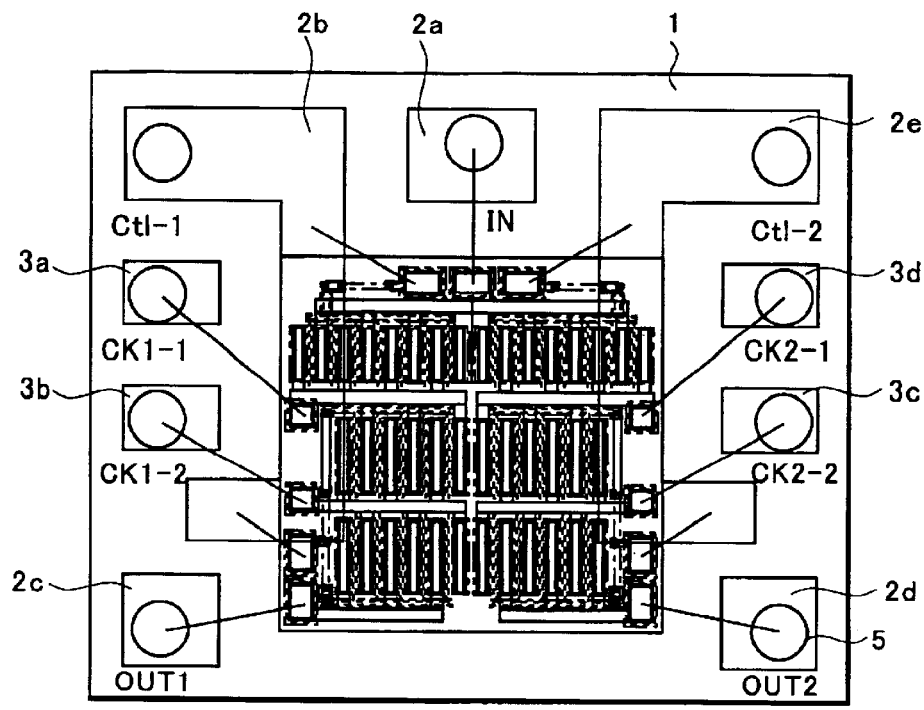
FIGS. 9A–9C are plan views of the device of the second embodiment.
Figure 9B:
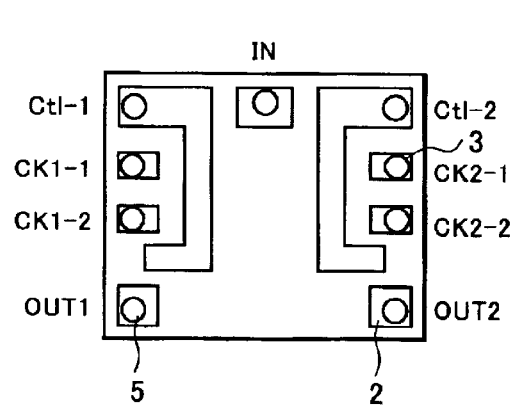
Figure 9C:
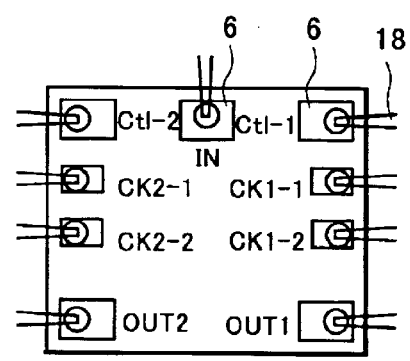
Figure 10A:
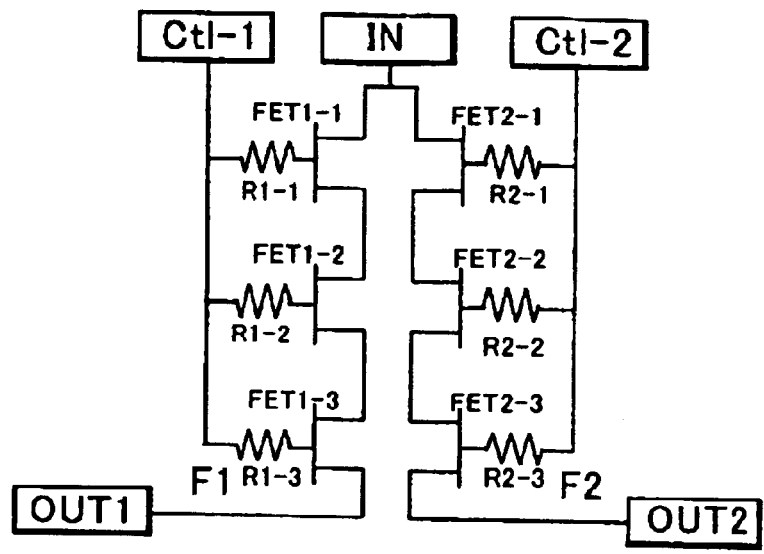
FIGS. 10A and 10B are equivalent circuit diagrams of a conventional device
Figure 10B:
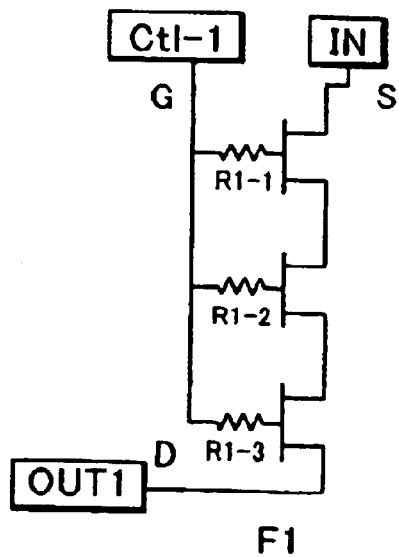

The switching circuit device is assembled in a chip-size package as shown in FIGS. 9A and 9B. FIG. 9A shows the manner in which a chip is bonded on the insulating substrate 1, FIG. 9B is a pattern diagram of the leads 2 and 3 disposed on the insulating substrate 1, and FIG. 9C is a plan view showing the external electrodes on a rear surface of the insulating substrate 1.

The leads 2 and 3, each formed of a gold plating layer, are disposed on the insulating substrate 1 and at the central part, the semiconductor chip 7 is bonded and connected by the bonding wires 4 in the followed manner. The leads $2a$, $2b$, $2c$, $2d$, and $2e$ are disposed so as to respectively correspond to the common input terminal IN, the first control terminal Ctl-1, the first output terminal OUT1, the second control terminal Ctl-2, and the second output terminal OUT2. Also, the leads $3a$, $3b$, $3c$, and $3d$ are positioned at peripheral parts of the insulating substrate 1 so as to respectively correspond to the inspection terminals CK1-1, CK1-2, CK2-1, and CK2-2.

All of the electrodes of the respective FETs of the semiconductor chip 7 are electrically connected to the external terminals OT, the inspection terminals CK, and the corresponding external electrodes 6 via the bonding wires 4, the leads 2, the leads 3, and the through holes 5.

The external electrodes 6 connected to the external terminals OT are used by the user side, and in order to make the soldering connection resistance adequately small and secure a predetermined connection strength, an area of at least $0.2 \times 0.15$ mm$^2$ is necessary. Meanwhile, the external electrodes 6 connected to the inspection terminals CK may be small since these are not used by the user side. Specifically, since for use just in DC inspections prior to shipment, it is sufficient that it be possible to put DC inspection probes 18 in contact, it is adequate for these electrodes to be at least $0.05 \times 0.05$ mm$^2$ in area.

DC inspections are performed on each FET after assembling in a package as shown in FIG. 9C That is, the probes 18 are put in contact with all of the external electrodes 6 connected to the external terminals OT and the inspection terminals CK, and DC inspection is carried out on each FET using a suitable measurement program upon making the selection among the external electrodes 6 onto which a bias is to be applied and the external electrode $6s$ on which a measurement is to be made. Since the probes 18 can be put in contact with the drain electrode of FET1-1 and the source electrode of FET1-2, the drain electrode of FET1-2 and the source electrode of FET1-3, the drain electrode of FET2-1 and the source electrode of FET2-2, and the drain electrode of FET2-2 and the source electrode of FET2-3, which could not be probed in the conventional art as described above, DC inspections can be performed on all six FETs.

By measuring the ON resistances of all FETs by the DC inspections, users can be insured of the insertion loss of the switching circuit device. Also, by measuring the leak currents (Igss) of the FETs, the isolation of the switching circuit device can be insured. Furthermore, by measuring the IDSS and the pinch-off voltages of the FETs, users can be insured of the output power of the switching circuit device.

Furthermore, the electrostatic energies that are applied between the first output terminal OUT1 and the first control terminal Ctl-1, between the common input terminal IN and the first control terminal Ctl-1, between the second output terminal OUT2 and the second control terminal Ctl-2, and between the common input terminal IN and the second control terminal Ctl-2 interval can be respectively attenuated.

What is claimed is:

1. A switching circuit device comprising:
   a first set of field effect transistors connected in series;
   a second set of field effect transistors connected in series;
   a common input terminal connected to a source electrode or a drain electrode of a transistor positioned at one end of the first set and connected to a source electrode or a drain electrode of a transistor positioned at one end of the second set;
   a first output terminal connected to a source electrode or a drain electrode of a transistor positioned at other end of the first set;
   a second output terminal connected to a source electrode or a drain electrode of a transistor positioned at other end of the second set;
   a first control terminal connected to gate electrodes of all the transistors of the first set;
   a second control terminal connected to gate electrodes of all the transistors of the second set; and
   a protecting element comprising an insulating region disposed between two high impurity concentration regions,
   wherein the protecting element is connected between the source or drain electrode of the transistor positioned at the one end of the first set and the gate electrode of the transistor positioned at the one end of the first set, between the source or drain electrode of the transistor positioned at the one end of the second set and the gate electrode of the transistor positioned at the one end of the second set, between the source or drain electrode of the transistor connected to the first output terminal and the gate electrode of the transistor connected to the first output terminal, or between the source or drain electrode of the transistor connected to the second output terminal and the gate electrode of the transistor connected to the second output terminal.

2. A switching circuit device comprising:
   a first set of field effect transistors connected in series and formed on a chip;
   a second set of field effect transistors connected in series and formed on the chip;
   a common input terminal connected to a source electrode or a drain electrode of a transistor positioned at one end of the first set and connected to a source electrode or a drain electrode of a transistor positioned at one end of the second set;
   a first output terminal connected to a source electrode or a drain electrode of a transistor positioned at other end of the first set;
   a second output terminal connected to a source electrode or a drain electrode of a transistor positioned at other end of the second set;
   a first control terminal connected to gate electrodes of all the transistors of the first set;
   a second control terminal connected to gate electrodes of all the transistors of the second set;
   a plurality of electrode pads formed on the chip, each of the electrodes pads being connected to one of the terminals; and
   a high impurity concentration region formed at a periphery of each of the electrode pads,
   wherein the electrode pad connected to the common input terminal and the electrode pad connected to a gate electrode of the transistor positioned at the one end of the first or second set are disposed at both sides of and adjacent a narrow insulating region, or the electrode pad connected to the first or second output terminal and the electrode pad connected to a gate electrode of a corresponding transistor positioned at the other end of the first or second set are disposed at both sides of and adjacent another narrow insulating region.

3. The switching circuit device of claim 2, wherein the electrode pad connected to the common input terminal and the electrode pad connected to the gate electrode of the transistor positioned at the one end of the first set are disposed at both sides of and adjacent one of the narrow insulating regions, the electrode pad connected to the common input terminal and the electrode pad connected to the gate electrode of the transistor positioned at the one end of the second set are disposed at both sides of and adjacent one of the narrow insulating regions, the electrode pad connected to the first output terminal and the electrode pad connected to the gate electrode of the corresponding transistor positioned at the other end of the first set are disposed at both sides of and adjacent one of the narrow insulating regions, and the electrode pad connected to the second output terminal and the electrode pad connected to the gate electrode of the corresponding transistor positioned at the other end of the second set are disposed at both sides of and adjacent one of the narrow insulating regions.

4. The switching circuit device of claim 2, further comprising a plurality of additional electrode pads that are connected to a gate electrode, a source electrode or a drain electrode of the transistors that not connected to the terminals, the additional electrode pads being connected to inspection terminals.

5. The switching circuit device of claim 2, further comprising:
   an insulating substrate, the chip being bonded to a front surface of the insulating substrate;
   external electrodes disposed on a rear surface of the insulating substrate, each of the external electrodes being provided for one of the terminals;
   a plurality of conductive leads disposed on the front surface of the insulating substrate, each of the conductive leads being connected to one of the external electrodes and one of the electrode pads; and
   a resin layer covering the chip and insulating substrate.

6. The switching circuit device of claim 3, further comprising:
   an insulating substrate, the chip being bonded to a front surface of the insulating substrate;
   external electrodes disposed on a rear surface of the insulating substrate, each of the external electrodes being provided for one of the terminals;

a plurality of conductive leads disposed on the front surface of the insulating substrate, each of the conductive leads being connected to one of the external electrodes and one of the electrode pads; and a resin layer covering the chip and insulating substrate.

7. The switching circuit device of claim 6, wherein all the gate electrodes of the transistors of the first set are connected to one of the conductive leads through corresponding electrode pads, and all the gate electrodes of the transistors of the second set are connected to another of the conductive leads through corresponding electrode pads.

8. The switching circuit device of claim 4, further comprising:

an insulating substrate, the chip being bonded to a front surface of the insulating substrate;

external electrodes disposed on a rear surface of the insulating substrate, each of the external electrodes being provided for one of the terminals;

a plurality of conductive leads disposed on the front surface of the insulating substrate, each of the conductive leads being connected to one of the external electrodes and one of the electrode pads; and a resin layer covering the chip and insulating substrate.

9. The switching circuit device of claim 8, wherein the external electrodes connected to the inspection terminals are smaller than the external electrodes connected to the terminals that are not the inspection terminals.

10. A switching circuit device comprising:

a series of field effect transistors formed on a substrate and connected in series;

an input electrode pad disposed on the substrate and connected to a source electrode or a drain electrode of a transistor positioned at one end of the series;

an output electrode pad disposed on the substrate and connected to a source electrode or a drain electrode of a transistor positioned at other end of the series;

a first control electrode pad disposed on the substrate and connected to a gate electrode of the transistor at the one end of the series;

a second control electrode pad disposed on the substrate and connected to a gate electrode of the transistor at the other end of the series; the second control electrode pad being connected to the first control electrode pad;

a high impurity concentration region formed in the substrate and at a peripheral portion of each of the electrode pads;

wherein the input electrode pad and the first control electrode pad are disposed so that the high impurity concentration regions of the input electrode pad and the first control electrode pad face each other and are separated by a first thin portion of the substrate, or the output electrode pad and the second control electrode pad are disposed so that the high impurity concentration regions of the output electrode pad and the second control electrode pad face each other and are separated by a second thin portion of the substrate.

11. The switching circuit device of claim 10, wherein a thickness of the first thin portion or the second thin portion is 5 $\mu$m or smaller.

12. The switching circuit device of claim 10, wherein a thickness of the first thin portion or the second thin portion is such that a protecting element is formed between the corresponding high impurity concentration regions.

* * * * *